United States Patent [19]

Cohen

[11] 4,394,660
[45] Jul. 19, 1983

[54] PHASED ARRAY FEED SYSTEM

[75] Inventor: Leonard D. Cohen, Brooklyn, N.Y.

[73] Assignee: Eaton Corporation, Cleveland, Ohio

[21] Appl. No.: 217,947

[22] Filed: Dec. 18, 1980

[51] Int. Cl.³ .............................................. H04B 7/00
[52] U.S. Cl. ............................. 343/100 SA; 331/132
[58] Field of Search ................... 343/13 SA, 100 SA; 331/115, 132

[56] References Cited

U.S. PATENT DOCUMENTS

| 3,020,493 | 2/1962 | Carroll | 331/114 X |
| 3,653,046 | 3/1972 | Glance | 343/100 SA |
| 3,766,558 | 10/1973 | Kuechken | 343/100 SA |
| 3,798,645 | 3/1974 | Baurle et al. | 343/100 SA X |
| 3,832,713 | 8/1974 | Rubin | 343/100 SA |
| 4,314,250 | 2/1982 | Hanell et al. | 343/100 SA |

OTHER PUBLICATIONS

"Thin-Film Injection-Locked Oscillators and Negative-Resistance Amplifiers for 2-GH₃ Radio Repeater", by Ernesto Marazzi et al., IEEE Journal of Solid-State Circuits, Feb. 1972, S26150002, pp. 23-32.
"Wide-Band Phase Locking and Phase Shifting Using Feedback Control of Oscillators", by David Rubin, IEEE Transactions on Microwave Theory and Techniques, vol. MTT-20, No. 4, Apr. 1972, pp. 286-289.
"A Study of Locking Phenomena in Oscillators", by Robert Adler, Proceedings of the IRE and Waves and Electrons, 1946, pp. 351-357.

Primary Examiner—Theodore M. Blum
Attorney, Agent, or Firm—Kevin Redmond

[57] ABSTRACT

A combined phase shifter and signal source are formed by injection locking a variable frequency oscillator. The free running frequency control of the oscillator operates as a phase control when the oscillator is injection locked. The invention functions as a phase shifter which exhibits gain, permitting its use in a unique phased array antenna system.

2 Claims, 9 Drawing Figures

PHASED ARRAY FEED SYSTEM

BACKGROUND

1. FIELD

This invention relates to electronic phase shifters and, more particularly, to phase shifters which exhibit gain.

2. PRIOR ART

Phase shifters are devices designed to change the electrical phase of a signal. Two commonly used types of prior art phase shifters are the ferrite and varactor phase shifters.

The ferrite phase shifter, illustrated in FIG. 1, comprises a ferrite element 102 and a coil 103 contained within a waveguide 101. Input power, $P_i$ enters the waveguide as indicated by the arrow 105 and emerges as output power, $P_o$ at the opposite end of the waveguide, as indicated by arrow 106.

In the operation of the ferrite phase shifter, power received by the waveguide passes the ferrite element 102, where its phase is shifted in accordance with the magnetic state of the ferrite 102. The magnetic state is controlled by a current supplied to the terminals 104 of the coil 103.

This ferrite phase shifter has several drawbacks. It usually does not provide a continuous, variable electronic control of the phase over a broad frequency range, is not fast acting and it has a relatively high loss. For example, in the frequency bands from 26.5 to 110 GHz, it exhibits an insertion loss of 2 to 3.4 dB. Since power is difficult to generate at this frequency, these losses are a significant disadvantage.

FIG. 2 illustrates a varactor phase shifter in which two varactors serve as terminations in a waveguide hybrid. In this Figure, a waveguide hybrid 201 contains a wall 204 which divides the waveguide into two sections. At one end of the waveguide, varactors 202 and 203 are placed across the waveguide sections to serve as terminations. Bias voltage for the varactors is supplied to terminals 207 and 208. An opening 209, in the dividing wall 204, which is positioned close to the varactor terminations, permits power to pass from one section to the other.

In the operation of this device, input power, $P_i$ which enters one section of the waveguide, as indicated by the directional arrow 205, is incident upon the opening 209, where it divides equally between the two sections, is reflected by each varactor, and emerges from the waveguide as output power, $P_o$, indicated by directional arrow 206. The bias applied to the varactors through terminals 207 and 208 varies the value of the reactive termination presented by the varactors and thereby produces a phase shift in the signal that is dependent upon the varactor bias. Unfortunately, the waveguide hybrid makes this type of phase shifter relatively large and a separate signal source is necessary for its use. The ferrite and varactor phase shifters are commonly used types, but other types have been developed. For example, phase shift has been achieved in oscillators by varying the oscillator supply voltage. This approach has a number of serious disadvantages. The power output of the oscillator and the frequency stability of the oscillator are usually adversely affected by varying the supply voltage.

In general, currently available electronically controlled phase shifters exhibit one or more deficiencies including power instability, relatively high loss, lack of continuous variability over a broad frequency range, slow speed and large size.

The need for improvement in phase shifters becomes clear when considering a phased array antenna, which is a primary application for these devices. A phased array antenna system is illustrated in FIG. 6. This system comprised a plurality of antenna elements, represented by elements 605A through 605D spaced apart along a line 606 at a uniform distance "d", indicated by drawing numeral 606. To produce a wave front from these antenna elements that is parallel to the line 601, all the antenna elements must be supplied with signals which are at the same frequency and phase.

To produce a wave front at an angle $\phi$ with the line 601, the first element 605A is supplied with a signal that is at a reference phase of zero. The second element 605B is supplied with a signal at phase angle equal to electrical degrees to $$\frac{d \cdot \text{Sine } \phi}{\lambda/2\pi},$$

as indicated by drawing numeral 608. The third element is supplied with a signal at a phase angle equal in electrical degrees to $$\frac{2d \cdot \text{Sine } \phi}{\lambda/2\pi}$$

and so on for each succeeding element. In order to direct the beam in any direction accurately and quickly, it is necessary to precisely and rapidly set the phase of the signals at each antenna element.

A simple way of supplying the antenna elements with signals which have the required relative phase angles is shown in FIG. 7. In this Figure, four antenna elements 705A through 705D are spaced along a line 701 at a uniform distance d, indicated by drawing numeral 706. A signal source 710 supplies a signal to a divider 709 which distributes the signal to the antenna elements by way of phase shifters 708A through 708D. Each of the phase shifters is adjusted to provide the required phase shift in the signal it supplies to its antenna element. The primary disadvantages of this system are the loss in power in the phase shifters, the large range in phase shift required for each phase shifter and the relatively large size of the feed system made necessary by the separate phase shifters required for each element.

SUMMARY

An object of the present invention is to provide a phase shifter which exhibits to transmission loss.

An object of the present invention is to provide a phase shifter which exhibits gain.

An object of the present invention is to provide a phase shifter capable of operating over a wide frequency range.

An object of the present invention is to provide a signal source and phase shifter combined in a single device.

The present invention is essentially a tuned oscillator in which the tuned circuit within the oscillator carries out two functions. The first function is the conventional one of tuning the oscillator to a desired frequency; however, the second is unconventional and it is to vary the phase of the oscillator's output signal when the oscillator's frequency is set by means of an injection lock signal.

The present invention functions as phase shifter with gain when operating with an injection lock signal and has an overall size appreciably smaller than conventional, separate phase shifters and signal sources. By virtue of these features, the invention may be employed in a unique millimeter wave phase array antenna system, in which a portion of the output of one oscillator is used as the injection lock signal for a second oscillator. This arrangement increases the available phase shift of the second oscillator and constitutes a significant advantage in reducing the total number of phase shifters required and in reducing the size, cost and signal loss associated with multiple phase shifters.

DETAILED DESCRIPTION OF THE INVENTION

The present invention is a means of obtaining continuous electronic control of the phase of the output signal of an oscillator. This technique can be applied with equal effectiveness to narrow band or wideband oscillators. Wideband oscillators, such as many presently available voltage controlled oscillators (VCO's), may be adapted to incorporate the present invention to provide phase control over a large frequency band.

The operating mechanism is based on the change in phase which occurs when the resonant frequency of an oscillator circuit is changed, but the frequency of oscillation is constrained from changing by injection locking the oscillator to a reference source. For example, if a VCO is tuned by varactor control to a desired frequency and then injection locked, further varactor adjustment will result in a phase shift of the output signal relative to the locking signal. If the VCO is unlocked, returned to another frequency and relocked, further varactor adjustment will produce a corresponding change in phase. In this way, phase control is obtained over a large frequency band.

Figure 1:
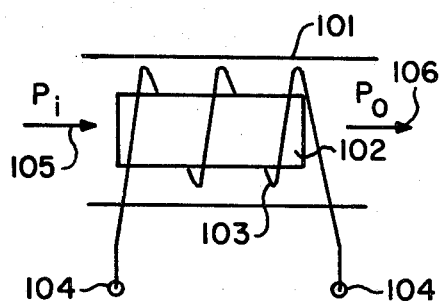
FIG. 1 is a schematic diagram of a prior art ferrite phase shifter.
Figure 2:
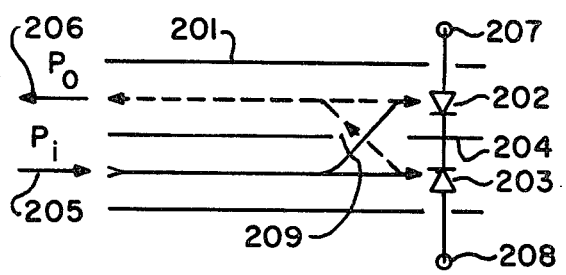
FIG. 2 is a schematic diagram of a prior art varactor phase shifter.
Figure 3:
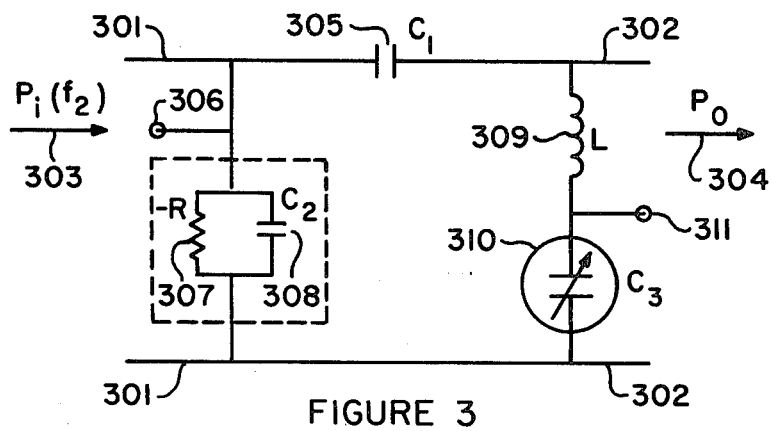
FIG. 3 is a schematic diagram of one embodiment of the present invention.

FIG. 3 illustrates a specific embodiment of the present invention. This circuit includes an input port 301, an output port 302, a negative resistance device 307, a device capacitance $C_2$ designated by drawing numeral 308, a supply port 306 for the negative resistance device 307, a coupling capacitor $C_1$ designated by drawing numeral 305, an inductance L designated by drawing numeral 309, a varactor capacitor $C_3$ designated by drawing numeral 310, and a control port 311 for the varactor capacitor.

The circuit of FIG. 3 is basically a variable frequency oscillator which includes a provision for accepting an injection lock signal to set the frequency of the oscillator. The input power $P_i$ of the injection lock signal, indicated by directional arrow 303, is applied to the oscillator input port 301. The phase of output power, $P_o$, from the oscillator, indicated by directional arrow 304, is adjusted by the varactor 310, which is controlled by the voltage applied to port 311.

In the operation of this circuit, the supply voltage for the negative resistance device, applied to port 306, causes the circuit to oscillate at the frequency of the tuned circuit, comprising principally the inductor 309 and the varactor 310, and to a lesser extent, capacitances $C_1$ and $C_2$.

Since the injection lock power, $P_i$ is usually much lower than the output power of the oscillator, the circuit of FIG. 3 functions as a phase shifter with gain. This circuit also provides a size advantage in that it combines a signal source and phase shifter in a single device. There are no components required for the present invention over that normally required for a voltage controlled oscillator. Unlike prior art devices in which the oscillator supply voltage is varied to adjust the phase, the supply voltage for the negative resistance device in the present invention is not varied to tune the oscillator, thereby avoiding the variation in output power and the reduction in stability inherent in this prior art approach.

Figure 4:
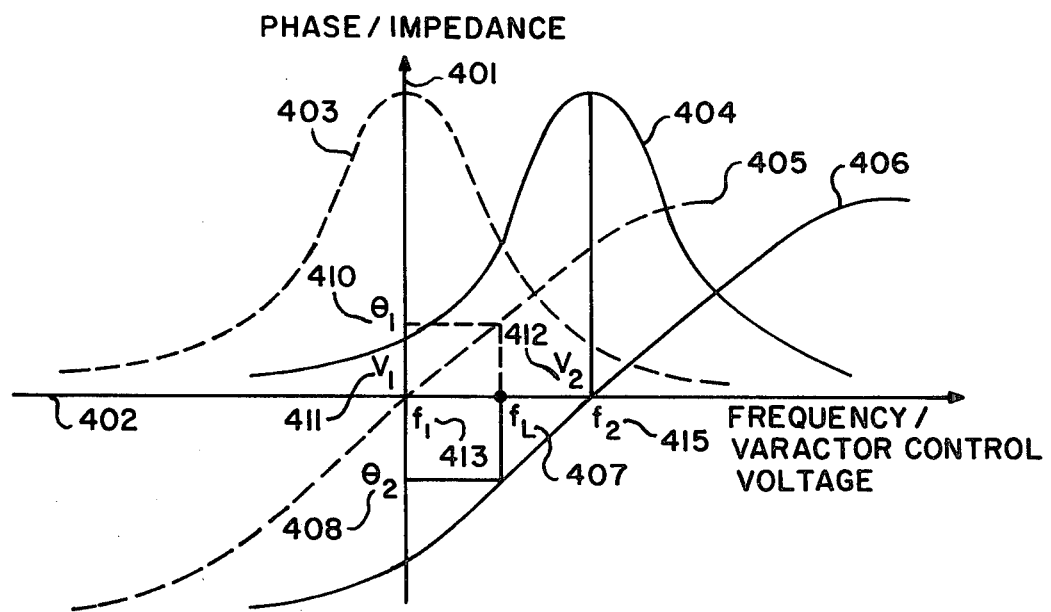
FIG. 4 is a graph of the impedance and phase of a resonant circuit.

The phase shift mechanism can be qualitatively described with the aid of FIG. 4. The curves represent the phase and impedance versus frequency characteristic of a simple parallel resonant circuit, where the capacitance is supplied by a varactor.

The abscissa 402 in FIG. 4 represents frequency and varactor control voltage, while the ordinate 401 represents phase and impedance. The dashed curves 403 and 405 represent the impedance and phase respectively of the parallel resonant circuit with a resonant frequency of $f_1$, designated by drawing numeral 413. The varactor control voltage $V_1$, designated by drawing numeral 411, is the voltage required to tune this circuit to $f_1$. If the varactor control voltage is changed to $V_2$, designated by drawing numeral 412, the resonance frequency shifts to $f_1$ and the impedance and phase curves shift to the positions shown by solid curve 404 and 406 respectively. If a signal at frequency $F_L$, indicated by drawing numeral 407, is applied to this circuit before it is shifted from a resonance frequency of $f_1$ to $f_2$, the phase of the output signal will shift from $\theta_1$, indicated by drawing numeral 410, to $\theta_2$ indicated by drawing numeral 408. This method of achieving a shift in phase at constant frequency is the fundamental mode of operation of the present invention.

The precise determination of the phase obtained with a locked oscillator however, is more complex. When an oscillator is injection locked to a reference source, the steady state phase difference between the oscillator and the locking signal is primarily a function of the initial frequency difference between them, and to a lesser extent it is a function of circuit Q, free-running oscillator frequency and the relative magnitude of the oscillator and locking signal levels. The larger the frequency difference between the free-running oscillator and the locking signal, the larger will be the steady state phase angle after locking. A phase shift $\theta_1$, indicated in FIG.

4, may be considered as representing the steady state phase shift after an oscillator with free-running frequency $f_o$ is injection locked to a signal at frequency $F_L$. The frequency of the oscillator will shift to $F_L$ and the phase difference between the output wave of the oscillator and the reference is $\theta_1$. The phase curve can be used to represent the lag or lead of oscillator output signal with respect to E, the inject lock signal. Positive phase angle corresponds to a phase lag of the oscillator relative to the locking signal. The phase angle $\theta$, after locking can be calculated from the equation.

$$\theta = \sin^{-1} \frac{\Delta f}{\frac{E_L}{E_o} \frac{f_o}{2Q} \sqrt{1+K^2}} + \sin^{-1} \frac{\Delta f}{\frac{f_o}{2Q} \sqrt{1+K^2}} \quad (1)$$

where $$K = f/f_o/2Q \quad (2)$$

$$f = f_o - f_L \quad (3)$$

$E_L$ = Locking signal voltage
$E_o$ = Output signal voltage

For small values of $\Delta f$ and $E_L/E_o$, the above equation reduces to $$\theta = \sin^{-1} \frac{E_o K}{E_L} \quad (4)$$

After being locked, the phase of the output signal of the oscillator can be continuously and electronically varied in a unique manner. Consider the simplified equivalent circuit of an injection locked oscillator shown in FIG. 3. The negative resistance, $-R$ is representative of the power generating capability of an active device, such as a Gunn diode. Let elements symbolized as $C_o$, $L_o$ and $R_o$ constitute the reactive and dissipative elements of the oscillator circuit transformed to the negative resistance terminals. The element $R_o$ is representative of both circuit losses and external loading. The above description can be applied to thermionic and solid state devices, and, in general, to any device capable of exhibiting a negative resistance. If the magnitude of $-R$ is sufficient to sustain oscillation, the oscillation will be at a frequency given by $$f_o = \frac{1}{2\pi \sqrt{L_o C_o}} \quad (5)$$

As was illustrated in FIG. 4, where the resonant characteristic was translated from a position at $f_1$ to the position at $f_2$ as varactor voltage was increased, the corresponding change in phase is from $\theta_1$ (lag) to $\theta_2$ (lead). The total phase change is the sum $\theta_1 + \theta_2$, at constant output frequency $F_L$. The maximum total phase shift (lag plus lead) is a function of the parameters (Q, $\Delta f$, $f_o$ and $E_o/E_L$) as delineated by equation 1. The voltage ratio $E_o/E_L$ can be related to a power ratio $P_o/P_L$ which is called locking gain.

Injection locking as conventionally used is intended to improve the frequency stability of a nontunable free-running source, since under locked conditions and within the locking bandwidth, it takes on the stability characteristics of the locking source. The relative phase angle ($\theta$) after locking may be considered an error condition. However, in the present invention, the mode of operation is distinctly different. The oscillator to be locked is intentionally made to be a frequency variable device. That is, the oscillator, for example, may be a variable frequency, varactor-tuned oscillator, in which the frequency control element functions as a phase shift control element.

Figure 5:
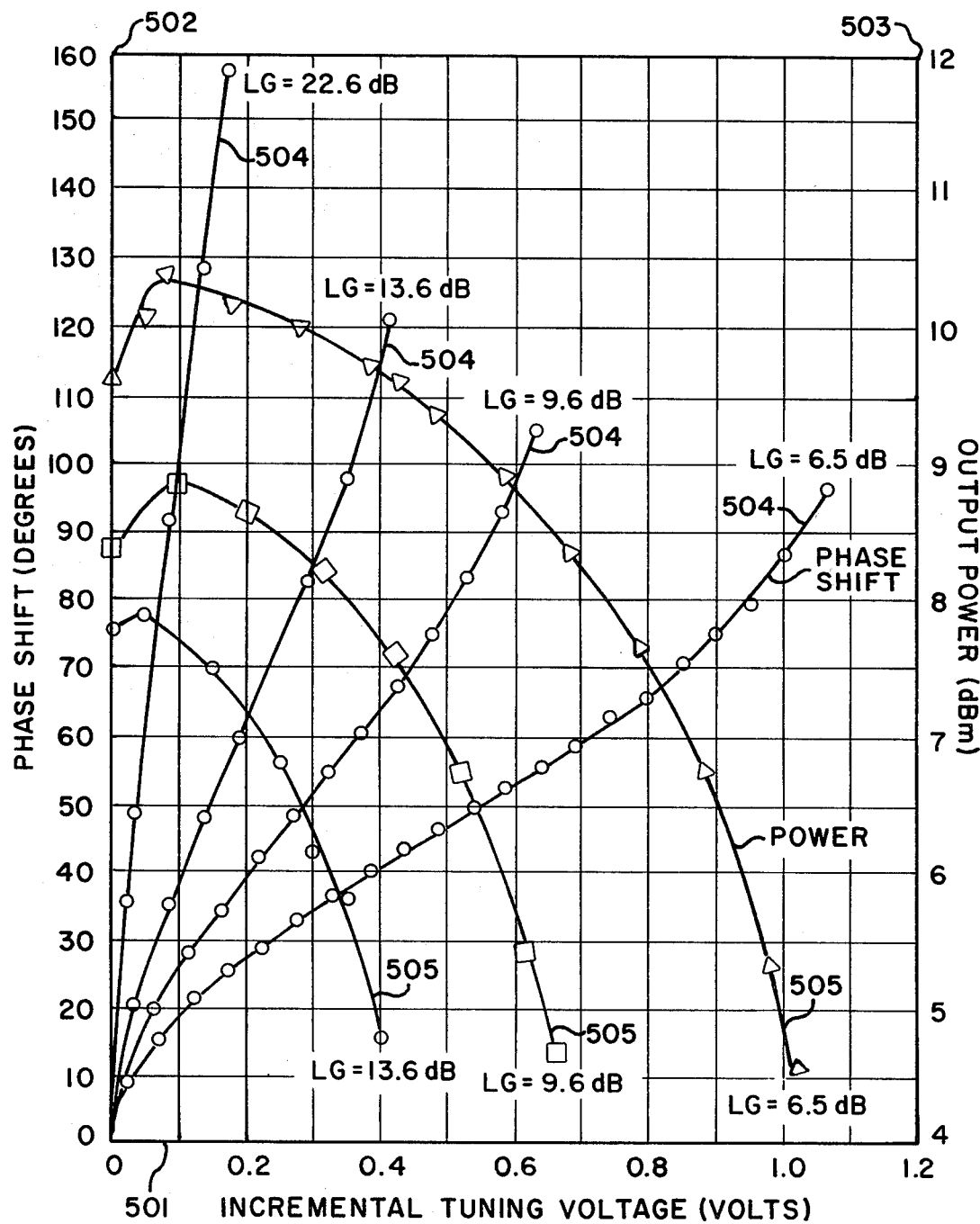
FIG. 5 is a graph of the performance of a specific embodiment of the present invention.

FIG. 5 is a graph indicating the performance of an oscillator operated in accordance with the present invention. The abscissa 501 indicates the incremental tuning voltage in volts, while the ordinate 502 indicates the phase shift in degrees. A second ordinate to the right 503 represents the output power in dBm. Curves 505 indicate the output power while curves 504 indicate the output phase. The measurements were made on a $K_u$-band lumped element VCO. Total phase shifts ranging from about 100 to 160 degrees at 12.85 GHz were obtained with output power in the milliwatt range.

It can be seen that the greatest phase change is obtained with the highest lock gain. For example, a phase shift of 160 degrees is possible with a locking gain of 22.6 dB, whereas a change of only about 100 degrees is possible with a locking gain of 6.5 dB.

Figure 8:
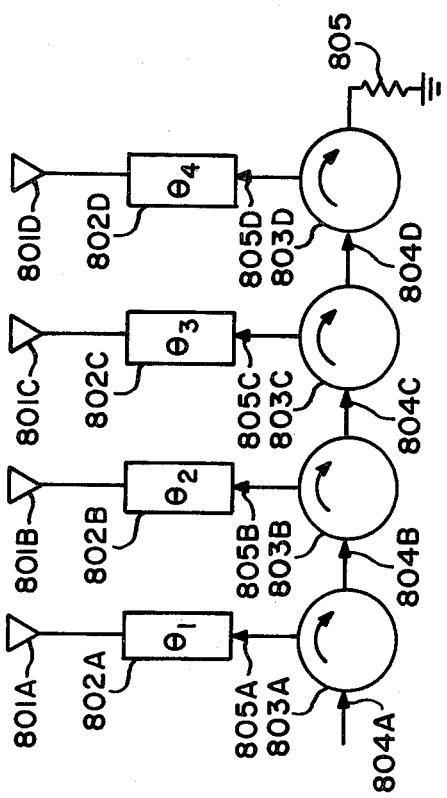
FIG. 8 is a schematic diagram of a unique phase array antenna and feed system embodying the present invention.
Figure 6:
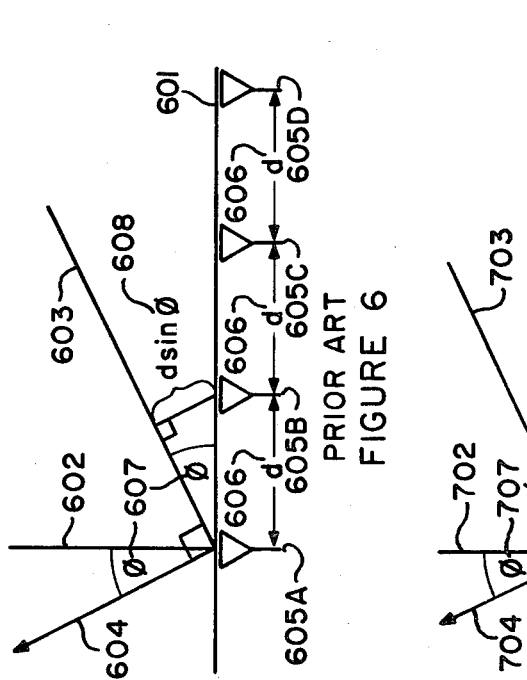
FIG. 6 is a schematic diagram of a phased array antenna system.
Figure 7:
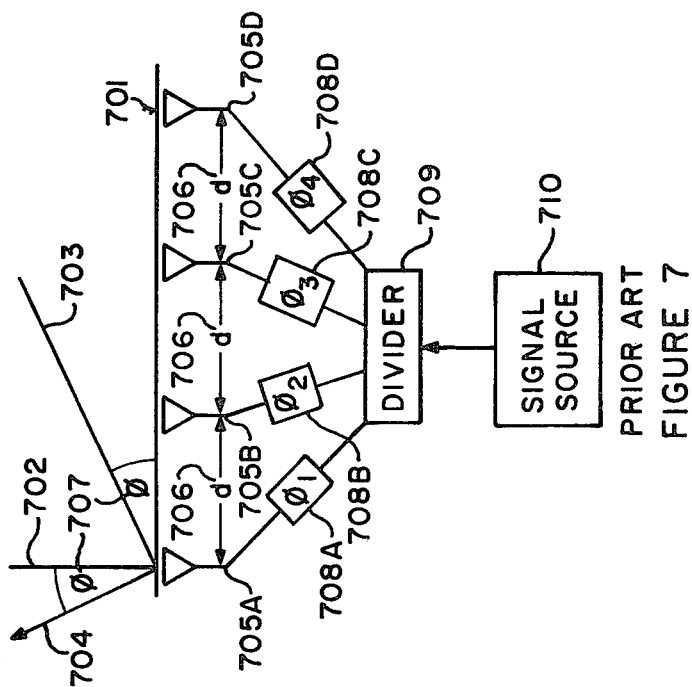
FIG. 7 is a schematic diagram of phased array antenna and feed system.

The performance characteristics of the present invention shown in FIG. 5 are particularly useful in phased arrays. Phased arrays consist of a plurality of antenna elements, each fed to produce a wave front propagating in a desired direction. This arrangement is illustrated in FIGS. 6 and 7. The present invention permits the fabrication of a different type of phased array feed system, which is illustrated in FIG. 8. In this Figure, four representative antenna elements 801A through 801D are supplied by four phase shifting devices 802A through 802D consisting of injection locked oscillators operated in accordance with the present invention. These devices receive an injection lock signal by way of circulators 803A through 803D. Circulator 803D, which is the last circulator in the series, terminates the injection lock signal in a resistive load 805.

In the operation of this system, a phased lock signal $P_i$ indicated by a directional arrow 806 is supplied to the first injection locked oscillator 802A by way of the first circulator 803A. The major portion of the oscillator's output signal is coupled to its associated antenna. However, a small portion of the output signal of the first oscillator 802A is coupled through port 805A, circulator 803A, and circulator 803B, to the input port of the second oscillator 802B to serve as an injection lock signal. This process is repeated with each oscillator generating the injection lock signal for the next oscillator. The result of this process is the phase shift achieved through each oscillator serves as the reference for the next oscillator so that the output phase of each oscillator is the sum of phase shifts produced by all prior oscillator in the chain plus the phase shift produced in the individual oscillator under consideration.

The cumulative phase shift produced in this manner is useful in steering the wave front emitted from the antenna elements. This can be seen by referring to FIG. 6, where the phase shift required to be produced by each oscillator to generate a wave front is shown to increase along the oscillator chain. It is zero for the first, $$\frac{d \cdot \text{Sine } \theta}{\lambda/2\pi}$$

for the second and $$\frac{2d \cdot \text{Sine } \theta}{\lambda/2\pi}$$

for the third. Since the output phase of each successive oscillator is cumulative, the total phase shift capability required for each individual oscillator is greatly reduced.

This arrangement has the added advantage of eliminating the losses associated with dividing a single injection lock signal among many oscillators. The first injection lock signal represented in FIG. 8 is used only to supply the first oscillator in the phased array system. Each successive oscillator received its injection lock signal from the previous oscillator in the chain, and this is made possible by virtue of the "gain" exhibited by the phase shifters of the present invention.

Figure 9:
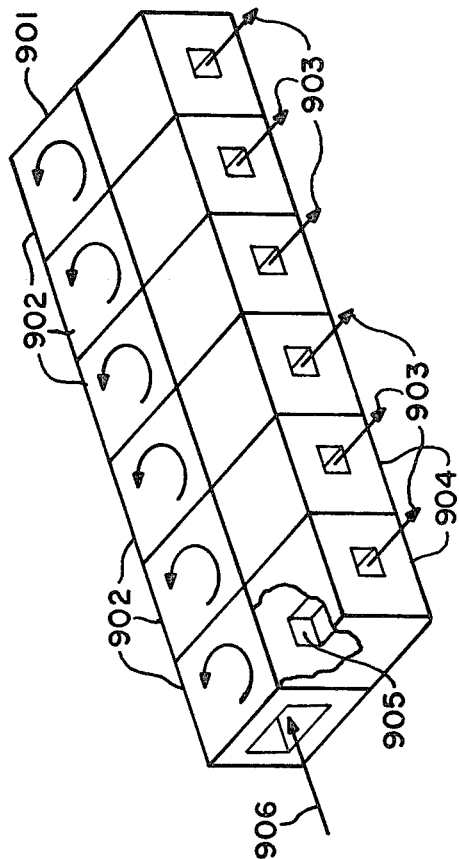
FIG. 9 is a pictorial diagram of a phased array distribution system using the present invention.

A pictorial view of a specific embodiment of the phased array system of FIG. 8 is illustrated in FIG. 9 and is designated by drawing numeral 901. This system comprises a series of circulators 902, an input port to the first circulator to receive an injection lock signal 906, an output port of the first circulator to the first oscillator 905, and a series of oscillators 904, each providing output power as indicated by the directional arrows 903. The advantage of the present invention is providing a small, combined-signal-source-and-phase-shifter is evident from this compact structure. The volume ordinarily required for separate phase shifters and a corporate feed system is totally eliminated, typically reducing the volume by over 30 percent.

I claim:

1. A feed system for a phased array antenna, comprising:
   (a) a plurality of injection lock oscillators, each having a first input port for accepting an injection lock signal, a second input port for accepting a signal to control the phase of the oscillator's output signal and an output port for supplying the oscillator output signal to an external load, said second input port being separate and unconnected to any bias port used to supply bias power to said oscillator,
   (b) means for coupling each oscillator output port to an antenna element in a series of adjacent elements in a phased array antenna,
   (c) a tuned circuit within each oscillator for tuning the frequency of the oscillator when the oscillator is not injection locked and for adjusting the phase of the output signal of the oscillator when the frequency of the oscillator is controlled by the injection lock signal, the tuned circuit being tuned by a control signal applied to the second input port of the oscillator,
   (d) means for supplying an injection locked signal to the first input port of a first oscillator which supplies a first antenna element, and
   (e) means for coupling a portion of the output signal of each oscillator to the first input port of the next oscillator which supplies the next adjacent element in the array, the coupled signal serving as the injection lock signal for the oscillator receiving the coupled signal.

2. A method of feeding a phased array antenna, comprising:
   (a) supplying a plurality of injection locked oscillators, each having a first input port for accepting an injection lock signal, an output port for supplying the output signal of the oscillator to an external load, and a third port for controlling the phase shift of said oscillator, said third port being separate and unconnected to any bias port used to supply bias power to said oscillator and said third port accepting a phase control signal to set the phase and thus the beam direction of said phased array,
   (b) supplying means for coupling the output of each oscillator to an antenna element in a series of adjacent elements in a phased array,
   (c) supplying an injection lock signal to a first of the plurality of oscillators connected to a first element in the series of antenna elements, and
   (d) coupling a portion of the output of one oscillator to the first input port of the next oscillator supplying the next adjacent element in the array, the coupled signal serving as the injection lock signal for the oscillator receiving the coupled signal.

* * * * *